US008963164B2

United States Patent
Shimizu et al.

(10) Patent No.: US 8,963,164 B2
(45) Date of Patent: Feb. 24, 2015

(54) COMPOUND SEMICONDUCTOR DEVICE AND METHOD OF MANUFACTURING THE SAME

(75) Inventors: Sanae Shimizu, Kawasaki (JP); Kenji Imanishi, Kawasaki (JP); Atsushi Yamada, Kawasaki (JP); Toyoo Miyajima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 358 days.

(21) Appl. No.: 13/301,331

(22) Filed: Nov. 21, 2011

(65) Prior Publication Data

US 2012/0138956 A1 Jun. 7, 2012

(30) Foreign Application Priority Data

Dec. 2, 2010 (JP) .................................. 2010-269714

(51) Int. Cl.
| H01L 29/16 | (2006.01) |
| H01L 29/778 | (2006.01) |
| H01L 21/02 | (2006.01) |
| H01L 29/66 | (2006.01) |
| H01L 29/20 | (2006.01) |

(52) U.S. Cl.
CPC ...... *H01L 29/7787* (2013.01); *H01L 21/02458* (2013.01); *H01L 21/02507* (2013.01); *H01L 21/0254* (2013.01); *H01L 29/66462* (2013.01); H01L 29/2003 (2013.01)
USPC ............... 257/77; 257/18; 257/288; 257/615; 257/E29.089; 438/478; 438/479

(58) Field of Classification Search
None
See application file for complete search history.

(56) References Cited

U.S. PATENT DOCUMENTS

| 8,247,842 | B2 * | 8/2012 | Sato | 257/190 |
| 2003/0118066 | A1 * | 6/2003 | Bour et al. | 372/45 |
| 2009/0045438 | A1 * | 2/2009 | Inoue et al. | 257/192 |
| 2009/0179221 | A1 * | 7/2009 | Han | 257/103 |
| 2010/0244096 | A1 * | 9/2010 | Sato | 257/190 |
| 2011/0001127 | A1 * | 1/2011 | Sakamoto et al. | 257/22 |
| 2011/0006308 | A1 * | 1/2011 | Sato | 257/76 |
| 2011/0031532 | A1 * | 2/2011 | Kikkawa et al. | 257/194 |
| 2011/0073911 | A1 * | 3/2011 | Sato | 257/194 |
| 2012/0126239 | A1 * | 5/2012 | Keller et al. | 257/76 |

(Continued)

FOREIGN PATENT DOCUMENTS

| JP | 2007-258230 A | 10/2007 |
| JP | 2007-273597 | 10/2007 |

(Continued)

OTHER PUBLICATIONS

JPOA—Office Action of Japanese Patent Application No. 2010-269714 dated Oct. 21, 2014 with Partial Translation.

*Primary Examiner* — Minh-Loan Tran
*Assistant Examiner* — Fazli Erdem
(74) *Attorney, Agent, or Firm* — Fujitsu Patent Center

(57) ABSTRACT

A compound semiconductor device includes: a substrate; an electron transit layer formed over the substrate; an electron supply layer formed over the electron transit layer; and a buffer layer formed between the substrate and the electron transit layer and including $Al_xGa_{1-x}N(0 \le x \le 1)$, wherein the x value represents a plurality of maximums and a plurality of minimums in the direction of the thickness of the buffer layer, and the variation of x in any area having a 1 nm thickness in the buffer layer is 0.5 or less.

18 Claims, 12 Drawing Sheets

(56) References Cited

U.S. PATENT DOCUMENTS

2013/0248815 A1* 9/2013 Fuke et al. .................. 257/11
2013/0307024 A1* 11/2013 Kokawa et al. ............... 257/190

FOREIGN PATENT DOCUMENTS

| JP | 2010-232293 | 10/2010 |
| JP | 2010-245504 A | 10/2010 |

* cited by examiner

COMPOUND SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No. 2010-269714, filed on Dec. 2, 2010, the entire contents of which are incorporated herein by reference.

FIELD

The present invention relates to a compound semiconductor device and a method of manufacturing the device.

BACKGROUND

There has recently been active development of electronic devices (compound semiconductor devices) in which a GaN layer as an electron transit layer and an AlGaN layer are formed over a substrate. One of such compound semiconductor devices is a GaN high electron mobility transistor (HEMT). The use of a GaN HEMT as a switch for voltage source inverter enables both reduction of on-resistance and increase of withstand voltage. Reduction of standby power consumption and increase of operating frequency are also possible, as compared with Si transistors. For these reasons, reduction of switching loss and power consumption for inverters is possible. In addition, a reduction in size is possible as compared with Si transistors having a similar performance.

In a GaN HEMT, in which a GaN layer is used as an electron transit layer and AlGaN as an electron supply layer, strain is produced on the AlGaN due to the difference in lattice constant between AlGaN and GaN. For this reason, piezoelectric polarization occurs and a highly concentrated 2-dimensional electron gas (2DEG) is obtained. This GaN HEMT is therefore applied to high output power devices.

It is however difficult to manufacture a GaN substrate having good crystallinity. GaN layers and AlGaN layers are therefore conventionally formed over a Si substrate, a sapphire substrate or a SiC substrate by heteroepitaxial growth. In particular, Si substrates of a large diameter and a high quality are easily available at low costs. There has therefore been an increase in research into a structure where the GaN layer and AlGaN layer are grown over a Si substrate.

There is however a large difference in thermal expansion coefficient between the GaN layer/the AlGaN layer and the Si substrate. On the other hand, a high temperature treatment is required for epitaxial growth of GaN layer and AlGaN layer. Warping or cracking of the Si substrate may therefore occur due to the difference in thermal expansion coefficient during such high temperature treatment. The problem arising from the difference in thermal expansion coefficient can be suppressed by forming a buffer layer having a superlattice structure, in which two compound semiconductor layers having a different composition are alternately stacked, between the GaN layer and the AlGaN layer.

However, in conventional compound semiconductor devices utilizing an superlattice structure as a buffer layer, it is difficult to obtain good crystallinity of the electron transit layer and the electron supply layer formed thereover. Examples of the related art are Japanese Unexamined Patent Application Publications 2007-258230 and 2010-245504.

SUMMARY

According to an aspect of the invention, a compound semiconductor device includes: a substrate; an electron transit layer formed over the substrate; an electron supply layer formed over the electron transit layer; and a buffer layer formed between the substrate and the electron transit layer and including $Al_xGa_{1-x}N(0 \leq x \leq 1)$, wherein the x value represents a plurality of maximums and a plurality of minimums in the direction of the thickness of the buffer layer, and the variation of x in any area having a 1 nm thickness in the buffer layer is 0.5 or less.

According to another aspect of the invention, a method of manufacturing a compound semiconductor device includes: forming a buffer layer including $Al_xGa_{1-x}N(0 \leq x \leq 1)$ over a substrate; forming an electron transit layer over the buffer layer; and forming an electron supply layer over the electron transit layer, wherein the x value represents a plurality of maximums and a plurality of minimums in the direction of the thickness of the buffer layer and the variation of x in any area having a 1 nm thickness in the buffer layer is 0.5 or less.

The object and advantages of the invention will be realized and attained by at least those elements, features, and combinations particularly pointed out in the claims.

It is to be understood that both the foregoing general description and the following detailed description are exemplary and explanatory and are not restrictive of the invention, as claimed.

DESCRIPTION OF EMBODIMENTS

The present inventors have diligently researched the reason why it is difficult to achieve excellent crystallinity for the GaN layer and the AlGaN layer formed over the buffer layer in a compound semiconductor device which adopts a superlattice structure for the buffer layer, and as a result, the following have been discovered. The drastic change in composition between two adjacent layers in the buffer layer tends to produce microdefects around the interface of the two layers, and the crystal face may be damaged by the microdefects. The crystallinity of the GaN layer and the AlGaN layer may then be lowered.

Embodiments will then be concretely explained below with reference to accompanying drawings.

Figure 1A:
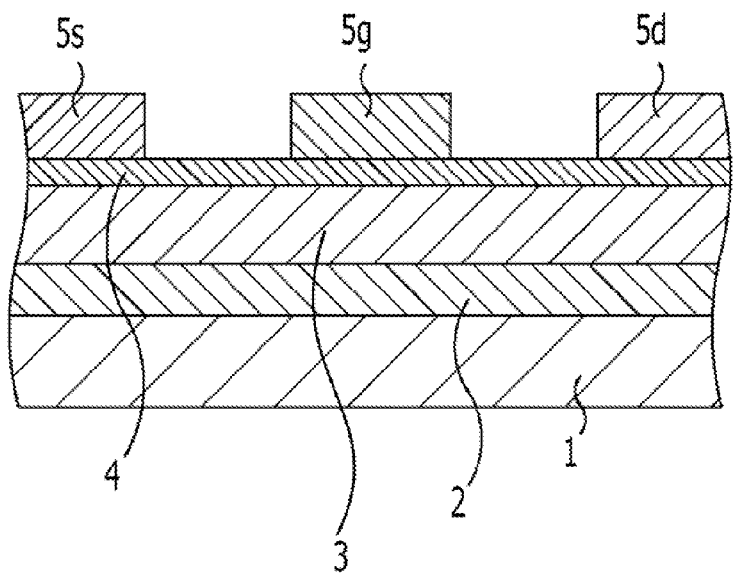
FIG. 1A is a sectional view illustrating a GaN HEMT structure according to a first embodiment.

A first embodiment will be first explained. FIG. 1A is a view which illustrates the structure of a GaN HEMT (compound semiconductor device) according to the first embodiment.

According to the first embodiment, a buffer layer 2 is formed over a substrate 1, an electron transit layer 3 is formed over the buffer layer 2, and an electron supply layer 4 is formed over the electron transit layer 3, as illustrated in FIG. 1A. A gate electrode 5g, a source electrode 5s and a drain electrode 5d are formed over the electron supply layer 4 in such a manner that the gate electrode 5g is sandwiched between the source electrode 5s and the drain electrode 5d.

Figure 1B:
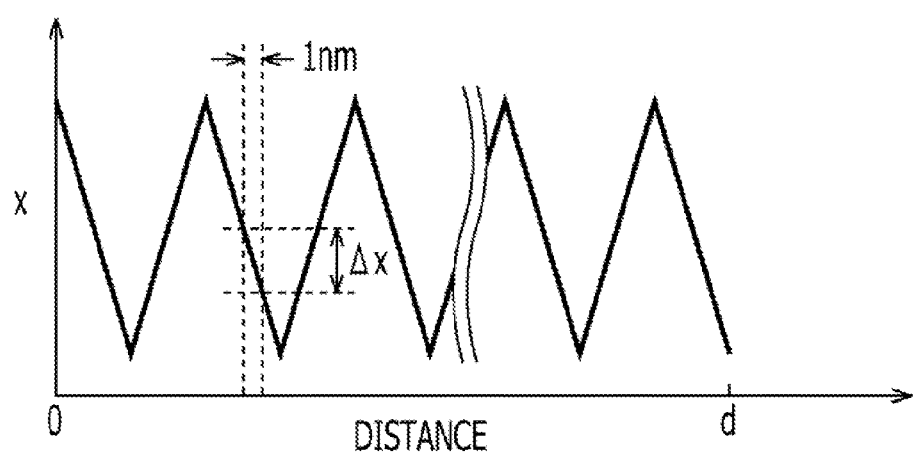
FIG. 1B is a graph illustrating distribution of x values.

The buffer layer 2 contains $Al_xGa_{1-x}N(0 \leq x \leq 1)$. The x value (Al composition) varies across the thickness of the buffer layer 2 as illustrated in FIG. 1B. The horizontal axis represents the distance from the interface between the buffer layer 2 and the substrate 1 in the direction of thickness, and the vertical axis represents the x value in FIG. 1B. The thickness of the buffer layer 2 is d. The variation of x or $\Delta x$ is 0.5 or lower anywhere within a thickness of 1 nm within the buffer layer 2. The decrease and increase of the x value are repeated. The variation of x or $\Delta x$ is preferably 0.01 or higher. When $\Delta x$ is below 0.01, it may be difficult to suppress warping.

Because the buffer layer 2, in which the x value varies across the thickness of the layer, is provided in this embodiment, even if there is a difference in thermal expansion coefficient between the substrate 1 and the electron transit layer 3 or the electron supply layer 4, the difference in thermal strain between these layers is decreased by the buffer layer 2. Warping or cracking or the like arising from the difference in thermal expansion coefficient can therefore be suppressed. Since $\Delta x$ is not higher than 0.5 and the variation in composition in the buffer layer 2 is gentle, microdefects can not easily occur within the buffer layer 2. This therefore results in good crystallinity for the electron transit layer 3 and the electron supply layer 4.

Figure 2A:
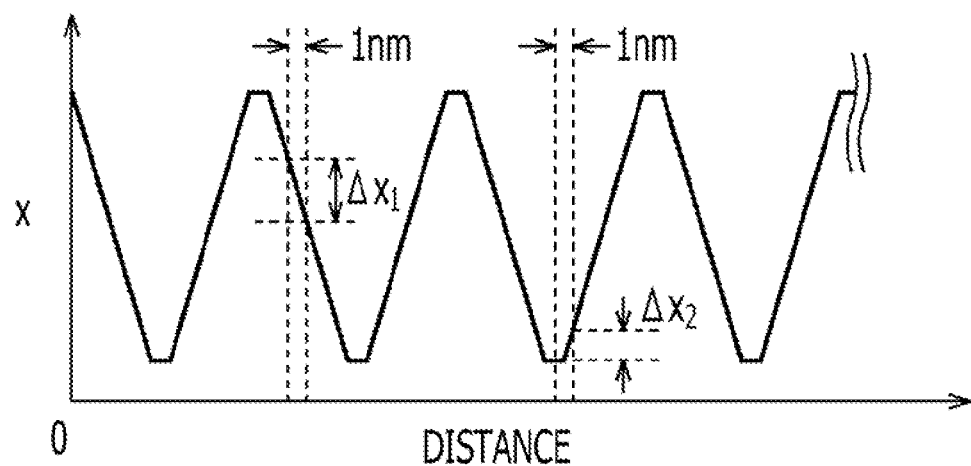
FIGS. 2A and 2B are graphs illustrating distributions of x values.
Figure 2B:
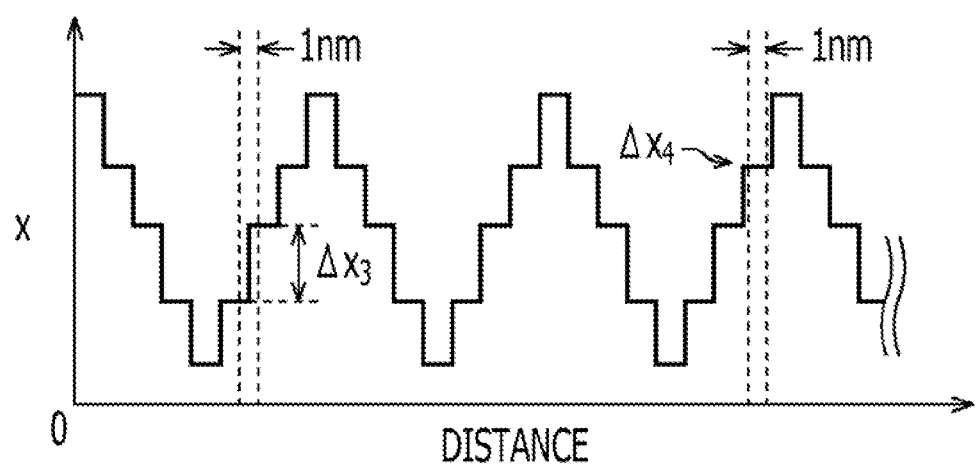

The x value does not need to vary everywhere across the thickness, and it may be constant in the maximum area and the minimum area as illustrated in FIG. 2A. In this case, $\Delta x_1$ in a 1 nm area between the maximum x value and the minimum x value is bigger than $\Delta x_2$ in a 1 nm area which includes the maximum x peak or the minimum x peak. Accordingly, a desired effect can be obtained if $\Delta x_1$ is not higher than 0.5. The x value may vary stepwise, as illustrated in FIG. 2B. In this case, the variation $\Delta x_3$ in a 1 nm area in thickness which includes a portion where the x value varies stepwise is bigger than $\Delta x_4$ in a 1 nm area across the thickness in which the x value is constant. When the variation $\Delta x_3$ is 0.5 or less, a desired effect can be obtained.

Figure 3:
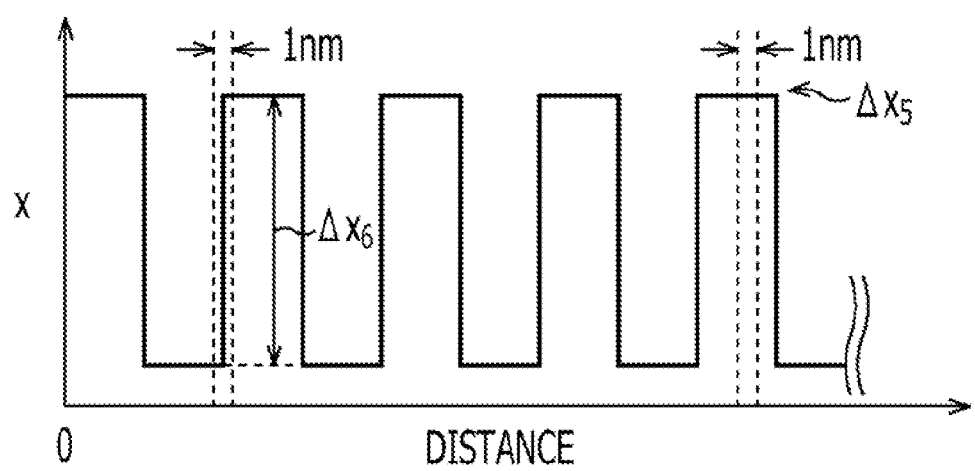
FIG. 3 is a graph illustrating the variation of x values in a reference example.

Even if the x value varies stepwise, microdefects may tend to be produced around a 1 nm area where the variation $\Delta x$ exceeds 0.5 and the crystalline face can be largely distorted. As illustrated in a reference example in FIG. 3 in which two compound semiconductor layers having different x values are stacked alternately, even if the variation $\Delta x_5$ is 0 in a certain area, the crystal face may be distorted from another area where the variation $\Delta x_6$ exceeds 0.5, and a desired effect can not be obtained.

Figure 4A:
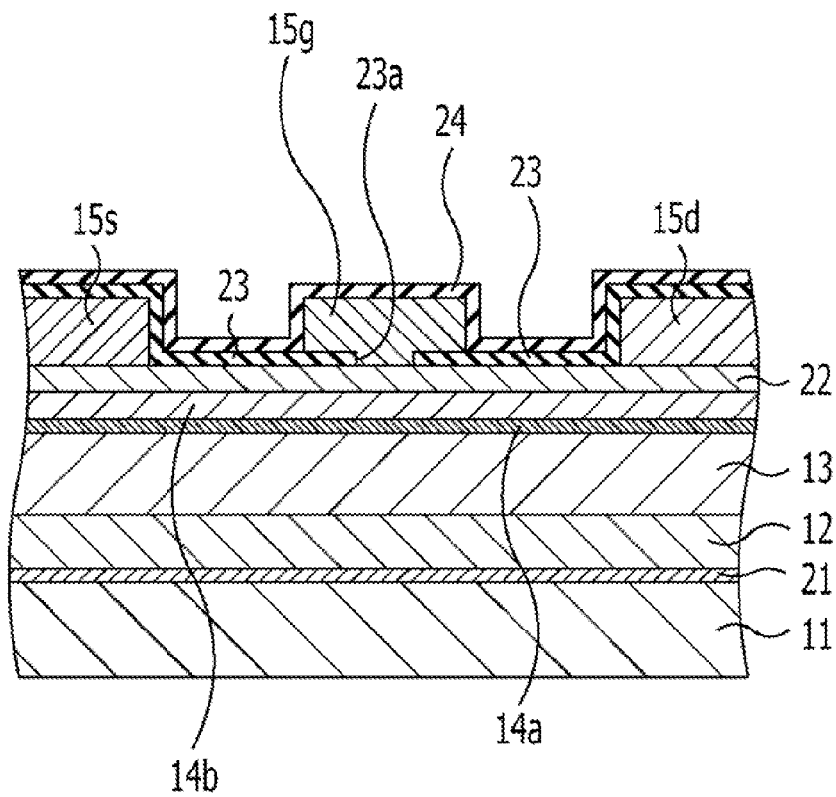
FIGS. 4A and 4B are sectional views illustrating a GaN HEMT structure according to a second embodiment.
Figure 4B:
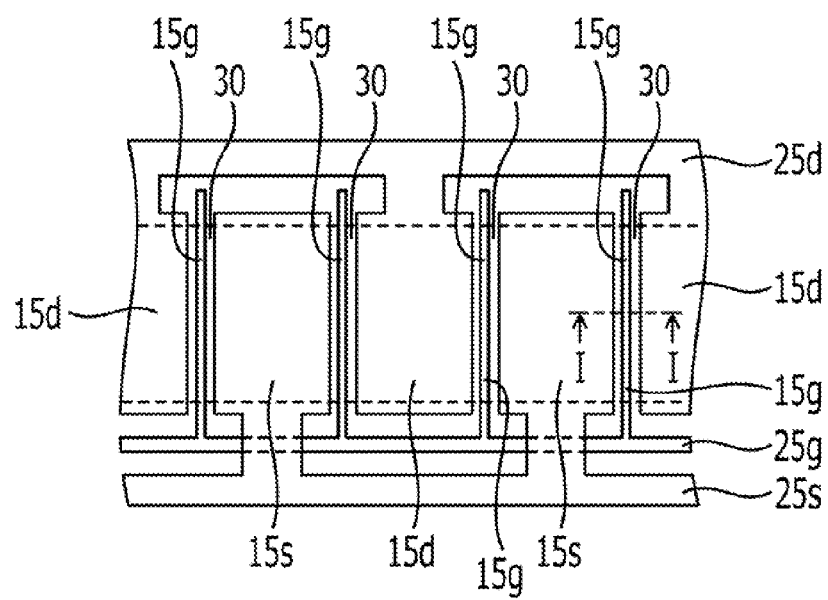

A second embodiment will now be explained. FIGS. 4A and 4B are sectional views which illustrate the structure of a GaN HEMT (compound semiconductor device).

In the second embodiment, as illustrated in FIG. 4A, an AlN layer 21 having a thickness of from 10 nm to 1 μm such as 50 nm is formed over a Si substrate 11. An AlGaN layer 12 having a thickness of from 1 μm to 10 μm such as 2 μm is formed over the AlN layer 21. The composition of the AlGaN layer 12 is represented by $Al_xGa_{1-x}N(0 \leq x \leq 1)$ and the x value or the composition of Al varies across the thickness of the AlGaN layer 12 as illustrated in FIGS. 5A to 5D. In other words, the decrease and the increase of the x value alternately and repeatedly occur. In FIGS. 5A to 5D, the horizontal axis represents the distance in the direction of thickness from the interface of the Si substrate 11 with the AlGaN layer 12, and the vertical axis represents the x value. The thickness of the AlGaN layer 12 is d.

Figure 5A:
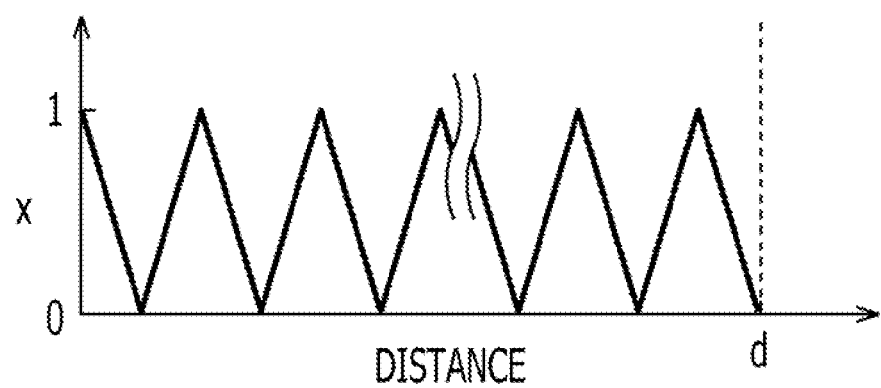
FIGS. 5A to 5D are graphs illustrating distribution of x values.
Figure 5B:
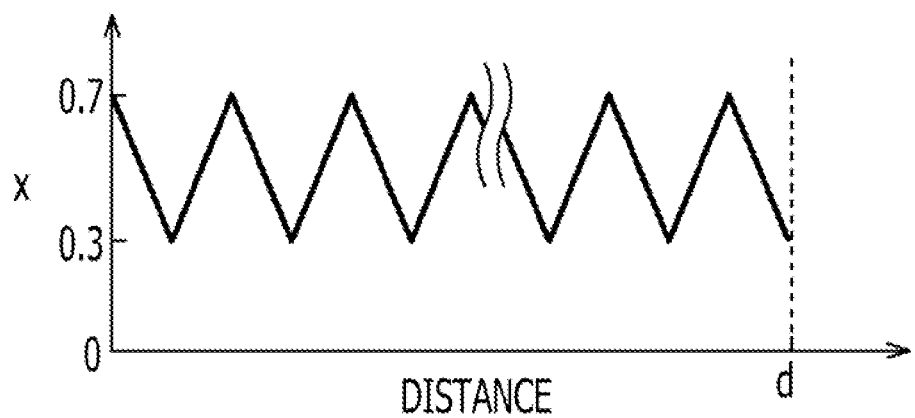
Figure 5C:
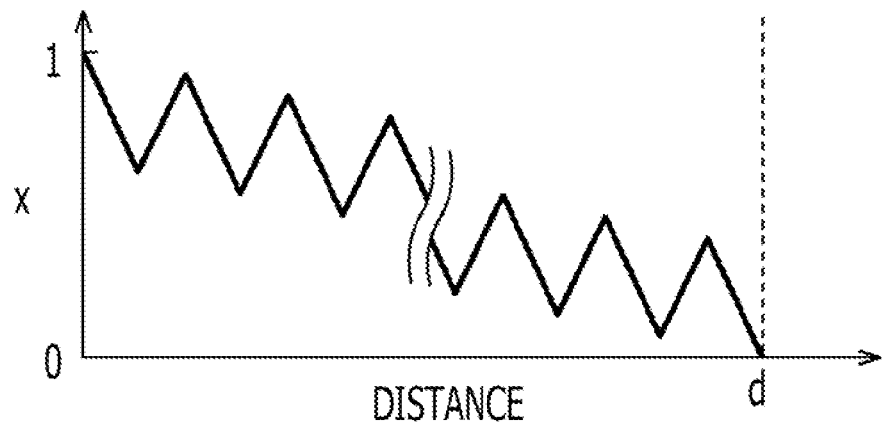
Figure 5D:
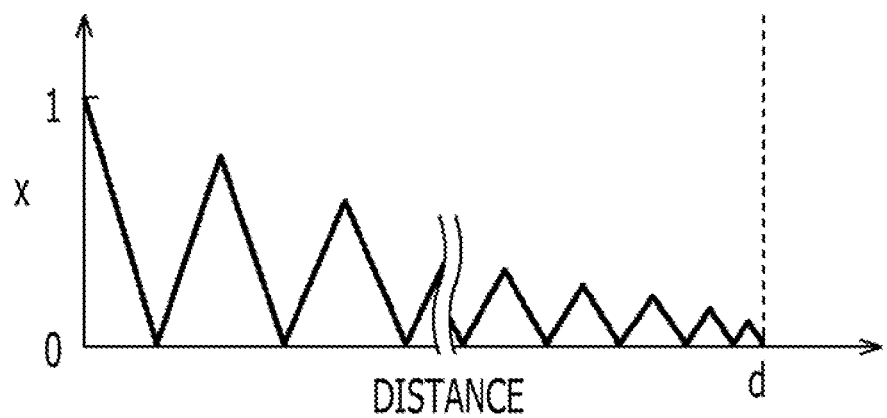

According to an example illustrated in FIG. 5A, the x value periodically varies between 0 and 1. According to an example illustrated in FIG. 5B, the x value periodically varies between 0.3 and 0.7. The difference between the maximum and the minimum x values is preferably 0.1 or higher. According to an example illustrated in FIG. 5C, the average x value in one cycle is smaller toward the i-GaN layer 13 where the distance of a maximum value of x to the next maximum value of x is defined as one cycle. According to an example illustrated in FIG. 5D, as in FIG. 5C, the average x value in one cycle is smaller toward the i-GaN layer 13. The minimum value of x is always 0, and the variation of x within one cycle becomes smaller toward the i-GaN layer 13. The slope of x value over the length (nm) is not higher than 0.5 in any of FIGS. 5A to 5D. The x value is preferably a minimum at a distance of d. The thickness which corresponds to one cycle is for example in the range of 20 nm to 30 nm, and the AlGaN layer 12 includes x variations of around 100 cycles. The x value does not need to vary as a linear function, it may vary as a quadratic function or an exponential function so long as the variation of x is 0.5 or less.

A non-doped i-GaN layer 13 having a thickness of 1 μm to 4 μm such as 3 μm is formed over the AlGaN layer 12, a non-doped i-GaN layer 14a having a thickness of 1 nm to 30 nm such as 5 nm is formed thereover, and an n-type n-AlGaN layer 14b having a thickness of 3 nm to 30 nm such as 30 nm is formed thereover. The Al composition of the i-AlGaN layer 14a and the n-AlGaN layer 14b is in the range of 0.1 to 0.5 such as 0.2. The n-AlGaN layer 14b is doped with Si in the range of $1 \times 10^{18}$ cm$^{-3}$ to $1 \times 10^{20}$ cm$^{-3}$ such as $5 \times 10^{18}$ cm$^{-3}$.

An n-type n-GaN layer 22 having a thickness of 2 nm to 20 nm such as 10 nm is formed over the n-AlGaN layer 14b. The n-GaN layer 22 is doped with Si in the range of $1 \times 10^{18}$ cm$^{-3}$ to $1 \times 10^{20}$ cm$^{-3}$ such as $5 \times 10^{18}$ cm$^{-3}$.

A source electrode 15s and a drain electrode 15d are formed over the n-GaN layer 22. The source electrode 15s and the drain electrode 15d are ohmically connected to the n-GaN layer 22. The source electrode 15s and the drain electrode 15d includes a Ti film and an Al film thereover. A passivation film 23 which covers the source electrode 15s and the drain electrode 15d is formed over the n-GaN layer 22. The passivation film 23 is for example a silicon nitride film. An opening 23a for the gate electrode is provided in the passivation film 23 between the source electrode 15s and the drain electrode 15d. A gate electrode 15g which has a schottky contact with the n-GaN layer 22 via the opening 23a is formed over the passivation film 23. The gate electrode 15g includes a Ni film and an Au film thereover. A passivation film 24 which covers the gate electrode 15g is also formed over the passivation film 23. The passivation films 23 and 24 have an opening for connection with a relay terminal and the like.

The layout which can be seen from the surface of the Si substrate is illustrated in FIG. 4B. The planar arrangement of the gate electrode 15g, the source electrode 15s and the drain electrode 15d is comb-like shape, and the source electrode 15s, and the drain electrode 15d are disposed alternately. A plurality of gate electrodes 15g are commonly connected to each other through a gate line 25g, a plurality of source electrodes 15s are commonly connected to each other through a source line 25s, and a plurality of drain electrodes 15d are commonly connected to each other through drain line 25d. The gate electrode 15g is disposed between these source and drain electrodes. Such a multi-finger structure can increase the output. The sectional view in FIG. 4A is a section taken along line I-I in FIG. 4B. The active area 30 includes the AlN layer 21, the AlGaN layer 12 and the i-GaN layer 13, an inactive area outside the periphery of the active area 30 is formed by ion implantation or mesa-etching.

In the second embodiment, a high concentration carrier is produced at the hetero-interface of the i-GaN layer 13 and the i-AlGaN layer 14a due to piezoelectric polarization. Electrons are induced around the interface of the i-GaN layer 13 and the i-AlGaN layer 14a by a piezo effect arising from a lattice mismatch. As a result, a 2-dimensional electron gas layer 2DEG appears and this serves as an electron transit layer or channel. The i-AlGaN layer 14a and the n-AlGaN layer 14b form an electron supply layer.

In the second embodiment, the AlGaN layer 12 is a buffer layer. Accordingly, even when there is a large difference in thermal expansion coefficient between the Si substrate 11 and any of the i-GaN layer 13, i-AlGaN layer 14a and the n-AlGaN layer 14b, the difference in thermal strain produced therein is alleviated by the AlGaN layer 12. Warping and cracking arising from the difference in thermal expansion coefficient can therefore be inhibited. In addition, the variation $\Delta x$ is 0.5 or less, and the change of the composition of the AlGaN layer 12 is moderate, microdefects therefore tend not to be produced within the AlGaN layer 12. It is therefore possible to achieve good crystallinity for the i-GaN layer 13, the i-AlGaN layer 14a or the n-AlGaN layer 14b.

A method of manufacturing a GaN HEMT (compound semiconductor device) according to the second embodiment will now be explained. FIGS. 6A to 6E are sectional views illustrating a method of manufacturing a GaN HEMT (compound semiconductor device) according to the second embodiment.

Figure 6A:
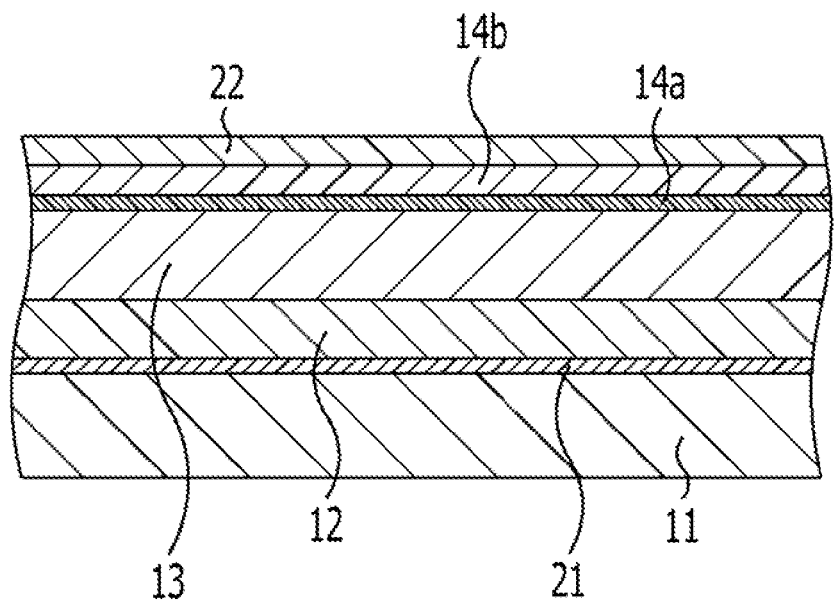
FIGS. 6A to 6E are sectional views illustrating a method of manufacturing a GaN HEMT according to the second embodiment.

As illustrated in FIG. 6A, an AlN layer 21, an AlGaN layer 12, an i-GaN layer 13, an i-AlGaN layer 14a, a n-AlGaN layer 14b and a n-GaN layer 22 are formed over the Si substrate 11. The formation of the AlGaN layer 12, the i-GaN layer 13, the i-AlGaN layer 14a, the n-AlGaN layer 14b and the n-GaN layer 22 is carried out by a crystal growth method such as metalorganic vapor phase epitaxy (MOVPE). These layers can be continuously formed by choosing a feed gas. Trimethyl aluminum (TMA) and trimethyl gallium (TMG) are used to obtain aluminum (Al) and gallium (Ga) respectively. Ammonia ($NH_3$) or the like are used to obtain nitrogen (N). With respect to a material for silicon (Si) contained as a impurity in the n-AlGaN layer 14b and the n-GaN layer 22, it can be silane ($SiH_4$). When the AlGaN layer 12 is formed, the x value (Al composition) is periodically adjusted as illustrated in any of FIGS. 5A to 5D by controlling the flow rate of TMA and TMG.

Figure 6B:
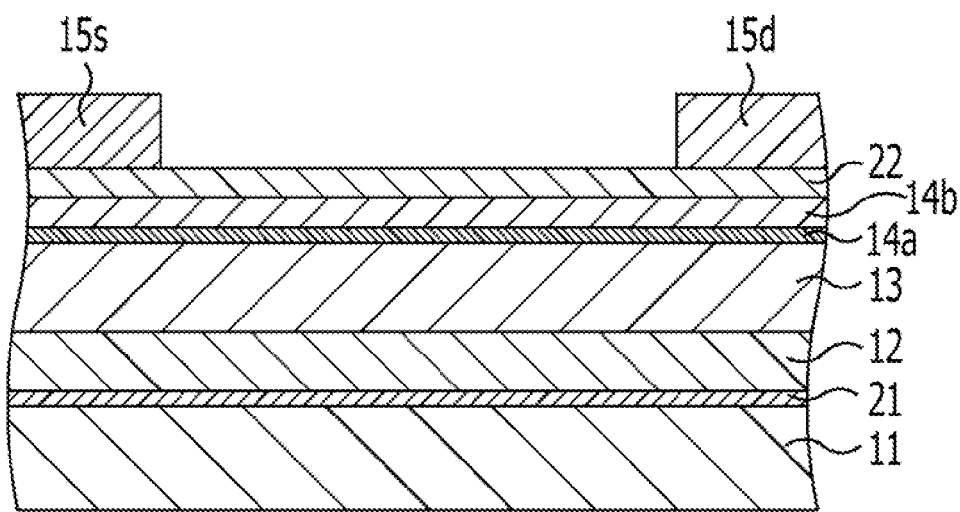

After the n-GaN layer 22 is formed, the source electrode 15s and the drain electrode 15d are formed over the n-GaN layer 22 by a lift-off method or the like as illustrated in FIG. 6B. The source electrode 15s and the drain electrode 15d are formed by forming a resist pattern which will finally become an area for the source electrode 15s and the drain electrode 15d, depositing Ti and Al thereover, and thereafter removing the Ti and Al attached over the resist pattern, together with the resist pattern. Then, a heat treatment in a nitrogen atmosphere at a temperature of 400° C. to 1,000° C. such as 600° C. is performed, and thereby an ohmic-contact is achieved.

Figure 6C:
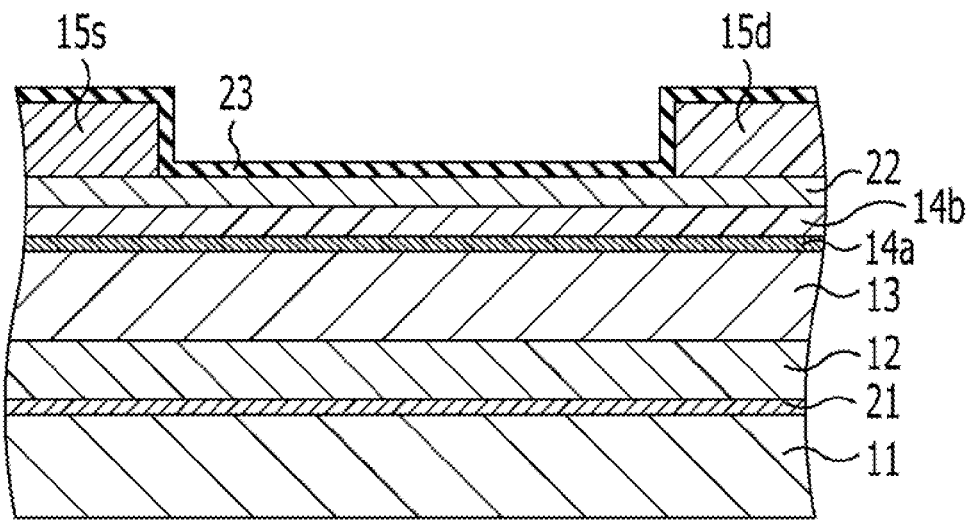

As illustrated in FIG. 6C, the passivation film 23 is formed over the n-GaN layer 22 in such a manner that the source electrode 15s and the drain electrode 15d are covered. The passivation film 23 is, for example, a silicon nitride film prepared by plasma chemical vapor deposition (CVD) or the like.

Figure 6D:
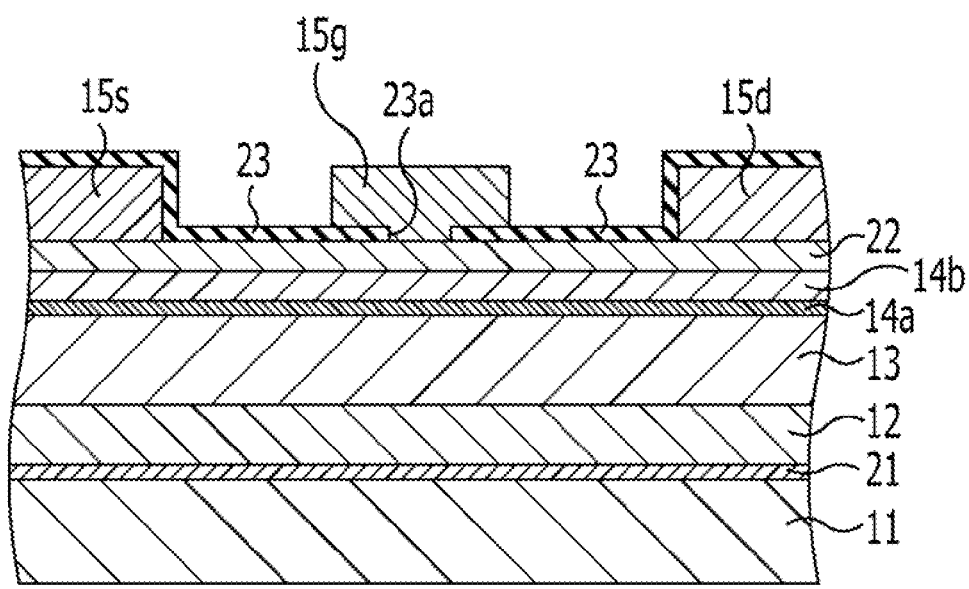

A resist pattern which will finally become an area for the opening 23a is formed. An opening 23a is formed in the passivation film 23 by performing etching with a resist pattern as illustrated in FIG. 6D. The gate electrode 15g which is in contact with the n-GaN layer 22 via the opening 23a is formed over the passivation film 23. The gate electrode 15g is formed by removing the resist pattern used for the formation of the opening 23a, forming a new resist pattern which will finally become an area for the gate electrode 15g, depositing Ni and Au, and removing the Ni and the Au attached to the resist pattern, together with the resist pattern.

Figure 6E:
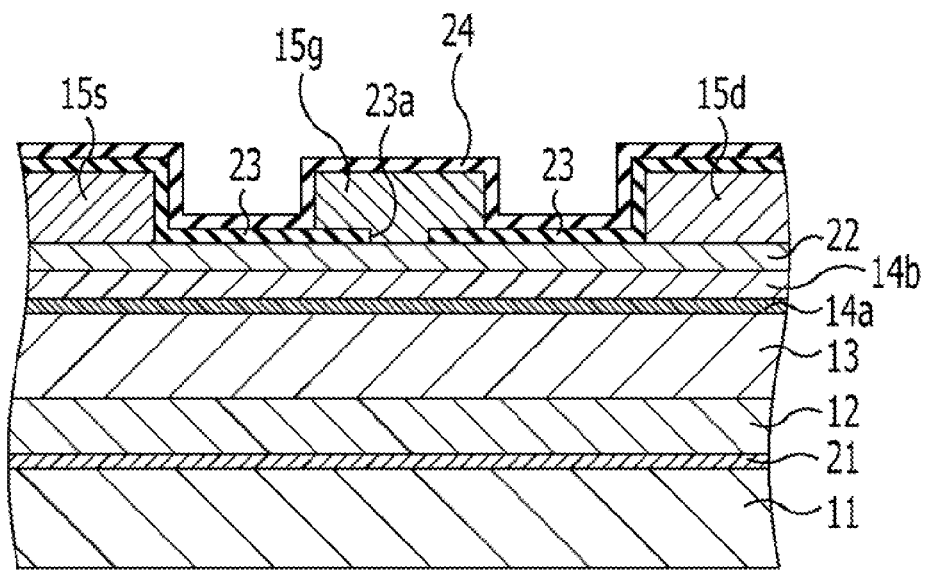

Thereafter, as illustrated in FIG. 6E, the passivation film 24 is formed over the passivation film 23 in such a manner that the gate electrode 15g is covered. The passivation film 24 is, for example, a silicon nitride film prepared by plasma CVD or the like.

The gate line 25g which commonly connects a plurality of gate electrodes 15g, the source line 25s which commonly connects a plurality of source electrodes 15s and the drain line 25d which commonly connects a plurality of drain electrodes 15d are formed (See FIG. 4B). The GaN HEMT as illustrated in FIGS. 4A and 4B can therefore be obtained.

Figure 7:
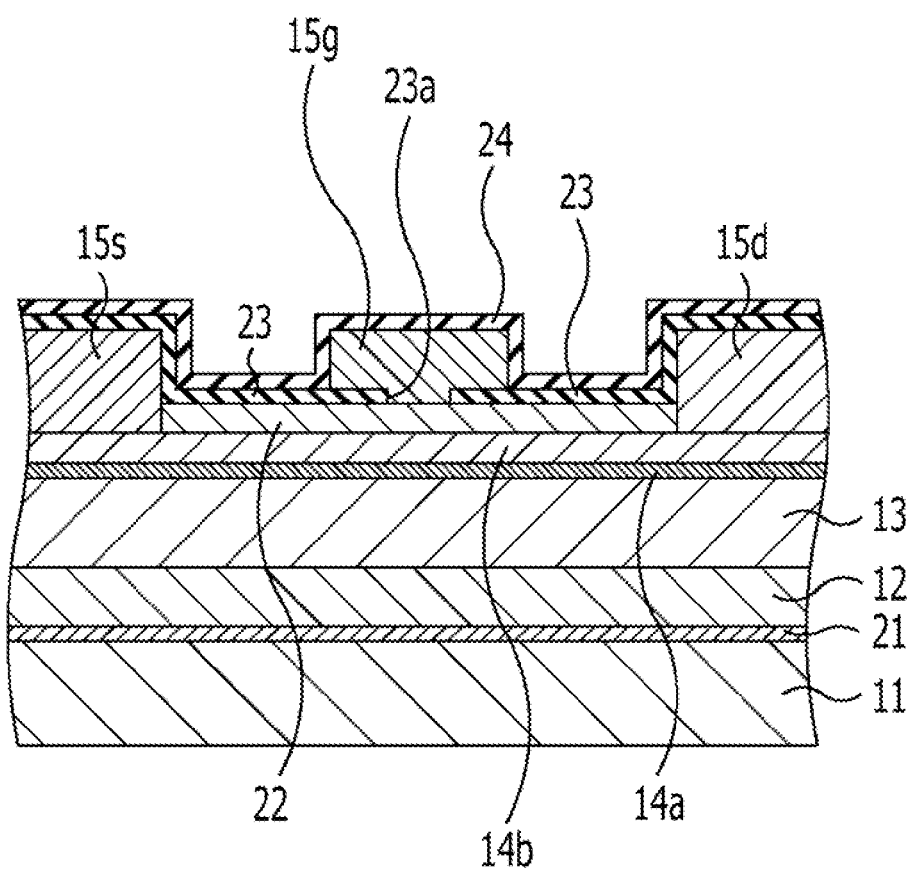
FIG. 7 is a sectional view illustrating a variation of the second embodiment.

As illustrated in FIG. 7, an opening for the source electrode 15s and the drain electrode 15d can be provided over the n-GaN layer 22, thereby the source electrode 15s and the drain electrode 15d can be in contact with the n-AlGaN layer 14b. In this case, with respect to the depth of the opening, a portion of the n-GaN layer 22 may remain unremoved, and a portion of the n-AlGaN layer 14b may be removed. In other words, the depth of the opening does not need to be identical to the depth of the n-GaN layer 22.

In addition, a resistor, a capacitor and the like can be mounted over the substrate 11 to make a monolithic microwave integrated circuit or MMIC.

Figure 8:
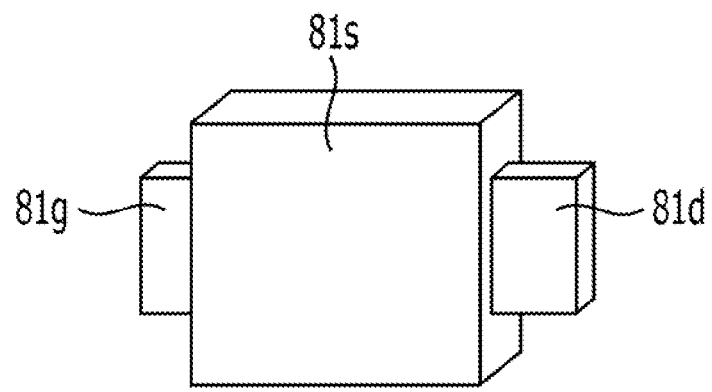
FIG. 8 is a diagram illustrating the appearance of a high output amplifier.

According to these embodiments, the GaN HEMT can be used as a high output amplifier. The appearance of a high output amplifier is illustrated in FIG. 8. In this example, a source terminal 81s which is connected to the source electrode is provided on the surface of a package. A gate terminal 81g which is connected to the gate electrode and a drain terminal 81d which is connected to the drain electrode extend over the side of the package.

Figure 9A:
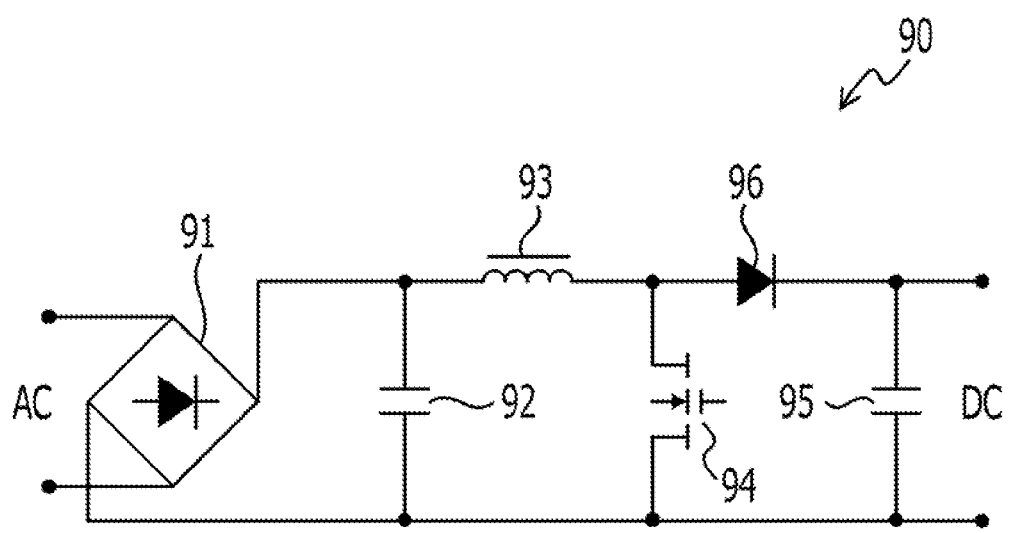
FIGS. 9A and 9B are diagrams illustrating a power supply.

In addition, the GaN HEMT according to these embodiments can be used as a power unit. FIG. 9A is a diagram illustrating a power factor correction (PFC) circuit, FIG. 9B is a diagram illustrating a server power supply (power unit) which includes the PFC circuit illustrated in FIG. 9A.

As illustrated in FIG. 9A, a capacitor 92 which is connected to a diode bridge 91 connected to an alternating current (AC) power supply is provided in the PFC circuit. One terminal of the capacitor 92 is connected to one terminal of a choke coil 93, the other terminal of the choke coil 93 is connected to one terminal of a switch element 94 and the anode of an diode 96. The switch element 94 corresponds to the HEMT in the above embodiments, and one terminal of the switch element corresponds to a drain electrode. The other terminal of the switch element 94 corresponds to the source electrode in the HEMT. The cathode of the diode 96 is connected to one terminal of the capacitor 95. The other terminal of the capacitor 92, the other terminal of the switch element 94 and the other terminal of the capacitor 95 are connected to ground. In addition, a direct current (DC) is obtained from both the terminals of the capacitor 95.

Figure 9B:
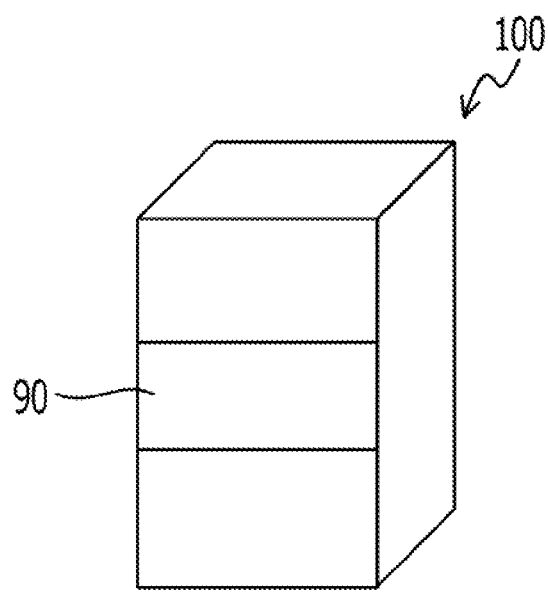

As illustrated in FIG. 9B, the PFC circuit 90 is incorporated into a server power supply 100 and the like for use.

A power unit with a higher speed of operation like the server power supply 100 can be manufactured. A switch element such as the switch element 94 can be used for a switch power supply and an electric device. Furthermore, such semiconductor devices can be used as a part of a full-bridge power circuit such as a server power circuit.

In any embodiment, a silicon carbide (SiC) substrate, a sapphire substrate, a silicon substrate, a GaN substrate and a GaAs substrate can be used. The substrate can be conductive, semi-insulating or insulating.

The structure of the gate electrode, the source electrode and the drain electrode is not limited to the above embodiments. One example is that it can be a mono-layer. The method for forming these electrodes is not limited to a lift-off method. Furthermore, a heat treatment can be omitted after the source electrode and the drain electrode are formed, so long as ohmic characteristics are obtained. The gate electrode can be subjected to a heat treatment.

In addition, the thickness of each layer and material and the like are not limited to those of the above embodiments.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments in accordance with aspects of the present invention have been described in detail, it should be understood that various changes, substitutions, and alterations could be made hereto without departing from the spirit and scope of the invention.

What is claimed is:

1. A compound semiconductor device comprising:
   a substrate;
   an electron transit layer formed over the substrate;
   an electron supply layer formed over the electron transit layer; and
   a buffer layer formed between the substrate and the electron transit layer and including $Al_xGa_{1-x}N(0 \le x \le 1)$, wherein
   the x value represents a plurality of maximums and a plurality of minimums in the direction of the thickness of the buffer layer, and the variation of x in any area having a 1 nm thickness in the buffer layer is 0.01 to 0.5.

2. The compound semiconductor device according to claim 1, wherein the x value varies continuously in the direction of thickness of the buffer layer.

3. The compound semiconductor device according to claim 1, wherein the x value is minimum at the upper surface of the buffer layer.

4. The compound semiconductor device according to claim 1, wherein the electron transit layer includes a GaN layer which is in contact with the upper surface of the buffer layer.

5. The compound semiconductor device according to claim 1, wherein the maximum and the minimum of the x value are respectively 1 and 0.

6. The compound semiconductor device according to claim 1, wherein an average of the x value within one cycle decreases toward the electron transit layer where the one cycle is defined as the distance between adjacent maximum peaks among the plurality of maximum x values.

7. The compound semiconductor device according to claim 1, wherein the variation of the x value within one cycle decreases toward the electron transit layer where the one cycle is defined as the distance between adjacent maximum peaks among the plurality of maximum x values.

8. The compound semiconductor device according to claim 1, wherein the substrate is a Si substrate, a SiC substrate or a sapphire substrate.

9. The compound semiconductor device according to claim 1, wherein the difference between adjacent maximum and minimum x values is 0.1 or higher.

10. A method of manufacturing a compound semiconductor device comprising;
    forming a buffer layer including $Al_xGa_{1-x}N(0 \le x \le 1)$ over a substrate;
    forming an electron transit layer over the buffer layer; and
    forming an electron supply layer over the electron transit layer, wherein
    the x value represents a plurality of maximums and a plurality of minimums in the direction of the thickness of the buffer layer and the variation of x in any area having a 1 nm thickness in the buffer layer is 0.01 to 0.5.

11. The method of manufacturing a compound semiconductor device according to claim 10, wherein the x value varies continuously in the direction of the thickness of the buffer layer.

12. The method of manufacturing a compound semiconductor device according to claim 10, wherein the x value is minimum at the upper surface of the buffer layer.

13. The method of manufacturing a compound semiconductor device according to claim 10, wherein the electron transit layer includes a GaN layer which is in contact with the upper surface of the buffer layer.

14. The method of manufacturing a compound semiconductor device according to claim 10, wherein the maximum and minimum values of the x value are respectively 1 and 0.

15. The method of manufacturing a compound semiconductor device according to claim 10, wherein an average of the x value within one cycle decreases toward the electron transit layer where the one cycle is defined as the distance between adjacent maximum peaks among the plurality of maximum x values.

16. The method of manufacturing a compound semiconductor device according to claim 10, wherein the variation of the x value within one cycle decreases toward the electron transit layer where the one cycle is defined as the distance between adjacent maximum peaks among the plurality of maximum x values.

17. The method of manufacturing a compound semiconductor device according to claim 10, wherein the substrate is a Si substrate, a SiC substrate or a sapphire substrate.

18. The method of manufacturing a compound semiconductor device according to claim 10, wherein the difference between adjacent maximum and minimum x values is 0.1 or higher.

* * * * *